United States Patent
Du et al.

(10) Patent No.: US 10,944,366 B2
(45) Date of Patent: Mar. 9, 2021

(54) ADVANCED LOAD CURRENT MONITORING CIRCUIT AND METHOD FOR A CLASS-AB AMPLIFIER

(71) Applicant: STMicroelectronics (Shenzhen) R&D Co., Ltd., Shenzhen (CN)

(72) Inventors: Ru Feng Du, Shenzhen (CN); XiangSheng Li, Shenzhen (CN)

(73) Assignee: STMICROELECTRONICS (SHENZHEN) R&D CO. LTD, Shenzhen (CN)

( * ) Notice: Subject to any disclaimer, the term of this patent is extended or adjusted under 35 U.S.C. 154(b) by 14 days.

(21) Appl. No.: 16/291,971

(22) Filed: Mar. 4, 2019

(65) Prior Publication Data
US 2020/0287507 A1 Sep. 10, 2020

(51) Int. Cl.
| | |
|---|---|
| H03F 1/52 | (2006.01) |
| H03F 3/21 | (2006.01) |
| H03F 3/189 | (2006.01) |
| H03F 3/24 | (2006.01) |
| H03F 3/45 | (2006.01) |

(52) U.S. Cl.
CPC ............. *H03F 3/211* (2013.01); *H03F 3/189* (2013.01); *H03F 3/245* (2013.01); *H03F 3/45071* (2013.01)

(58) Field of Classification Search
CPC ... H03F 1/52; H03F 1/523; H03F 3/38; H03F 3/217; H03F 3/2171
USPC ................... 330/207 P, 298, 10, 207 A, 251
See application file for complete search history.

(56) References Cited

U.S. PATENT DOCUMENTS

| | | | |
|---|---|---|---|
| 6,108,182 A * | 8/2000 | Pullen | H03F 1/52 330/298 |
| 6,445,530 B1 | 9/2002 | Baker | |
| 8,143,944 B2 | 3/2012 | Siniscalchi et al. | |
| 9,693,138 B2 | 6/2017 | Fraisse et al. | |
| 2004/0060026 A1* | 3/2004 | Stanley | H03F 1/52 327/334 |
| 2011/0193578 A1* | 8/2011 | Gautama | H03F 1/52 324/713 |
| 2015/0204925 A1 | 7/2015 | Hernandez et al. | |

FOREIGN PATENT DOCUMENTS

| | | |
|---|---|---|
| EP | 3145216 A1 | 3/2017 |
| EP | 3179257 A1 | 6/2017 |

* cited by examiner

*Primary Examiner* — Steven J Mottola
(74) *Attorney, Agent, or Firm* — Slater Matsil, LLP

(57) ABSTRACT

In an embodiment, a class-AB amplifier includes: an output stage that includes a pair of half-bridges configured to be coupled to a load; and a current sensing circuit coupled to a first half-bridge of the pair of half-bridges. The current sensing circuit includes a resistive element and is configured to sense a load current flowing through the load by: mirroring a current flowing through a first transistor of the first half-bridge to generate a mirrored current, flowing the mirrored current through the resistive element, and sensing the load current based on a voltage of the resistive element.

29 Claims, 4 Drawing Sheets

PRIOR ART

ADVANCED LOAD CURRENT MONITORING CIRCUIT AND METHOD FOR A CLASS-AB AMPLIFIER

TECHNICAL FIELD

The present invention relates generally to an electronic system and method, and, in particular embodiments, to an advanced load current monitoring circuit and method for a class-AB amplifier.

BACKGROUND

Power amplifiers are classified based on the characteristics of the output stage. In particular, the classes are based on the proportion of each input cycle in which the output device passes current. Conventional class-A amplifiers are simpler than class-B and class-AB amplifiers and use a single amplifying transistor that is biased such that the amplifying transistor is always conducting. For differential class-A amplifiers, the biasing point is typically selected to be equal to the maximum output current to allow for the amplification of the full range of the input signal.

Conventional class-B amplifiers use two amplifying transistors, each operating for half a cycle, in a push-pull configuration. Because of the non-overlapping of the signals of each amplifying device, the class-B amplifier typically has high crossover distortion.

Conventional class-AB amplifiers have a push-pull configuration that operates for more than half a cycle. To operate, class-AB amplifiers use biasing circuits that are typically more complex than the biasing circuits of class-A or class-B amplifiers. The overlap helps reduce the crossover distortion present in class-B amplifiers at the expense of higher quiescent current.

FIG. 1 shows output stage 102 of conventional class-AB audio power amplifier 100 for driving audio speaker 106, and load current sensor circuit 104 for sensing a load current flowing through audio speaker 106. FIG. 2 shows a graph of impedance versus frequency of a typical 4 Ω audio speaker.

SUMMARY

In accordance with an embodiment, a class-AB amplifier includes: an output stage that includes a pair of half-bridges configured to be coupled to a load; and a current sensing circuit coupled to a first half-bridge of the pair of half-bridges. The current sensing circuit includes a resistive element and is configured to sense a load current flowing through the load by: mirroring a current flowing through a first transistor of the first half-bridge to generate a mirrored current, flowing the mirrored current through the resistive element, and sensing the load current based on a voltage of the resistive element.

In accordance with an embodiment, a digital input class-AB amplifier includes: an output stage that includes a pair of half-bridges configured to be coupled to a load; a digital communication interface configured to receive an data stream; a digital core circuit; a digital-to-analog converter (DAC); a driver circuit configure to receive a signal from the DAC, and configured to control the output stage based on the received signal; a current sensing circuit coupled to a first half-bridge of the pair of half-bridges, the current sensing circuit including a resistive element and configured to sense a load current flowing through the load by: mirroring a current flowing through a first transistor of the first half-bridge to generate a mirrored current, flowing the mirrored current through the resistive element, and sensing the load current based on a voltage of the resistive element; and an analog-to-digital converter (ADC) coupled to the digital core circuit and configured to generate a digital signal based on the sensed load current.

In accordance with an embodiment, a method includes: driving a load with a class-AB amplifier; mirroring a current flowing through a first transistor of an output stage of the class-AB amplifier to generate a mirrored current; flowing the mirrored current through a resistive element; and sensing a load current flowing through the load based on a voltage of the resistive element.

In accordance with an embodiment, a digital input class-AB amplifier includes: an output stage that includes a pair of half-bridges configured to be coupled to an audio speaker; a digital communication interface configured to receive an audio stream; a digital core circuit; a DAC; a driver circuit configure to receive a signal from the DAC, and configured to control the output stage based on the received signal; a current sensing circuit including: a second transistor having a control terminal coupled to an output of a first half-bridge of the pair of half-bridges; a third transistor having a control terminal coupled to a current path of the second transistor; a first sense transistor having a control terminal coupled to a control terminal of a first transistor of the first half-bridge and having a current path coupled to a current path of the third transistor; a first resistor; a first current mirror coupled between the first sense transistor and the first resistor, the first current mirror configured to generate a first mirrored current that flows through the first resistor; a fourth transistor having a control terminal coupled to an output of a second half-bridge of the pair of half-bridges; a fifth transistor having a control terminal coupled to a current path of the fourth transistor; a second sense transistor having a control terminal coupled to a control terminal of a sixth transistor of the second half-bridge and having a current path coupled to a current path of the fifth transistor; a second resistor; a second current mirror coupled between the second sense transistor and the second resistor, the second current mirror configured to generate a second mirrored current that flows through the second resistor; and an analog-to-digital converter (ADC) coupled to the first and second resistors, the ADC configured to generate a digital signal based on voltage difference between a first node of the first resistor and a second node of the second resistor, where the digital core circuit is configured to estimate an impedance of the audio speaker based on the digital signal.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

The present invention will be described with respect to embodiments in a specific context, a load current monitoring circuit and method for a class-AB audio power amplifier. Embodiments of the present invention may be used in other circuits, such as, for example, other types of class-AB amplifiers.

In an embodiment of the present invention, load current flowing through an audio speaker is sensed without using sense resistors in series with the half-bridges of an output stage of a digital input class-AB amplifier. The sensed current is sensed in real-time and used to determine the impedance of the audio speaker, e.g., in real-time. The determined impedance of the audio speaker may be advantageously used for real-time speaker protection and real-time audio quality optimization. In some embodiments, real-time load current and/or real-time speaker impedance data may be streamed out of digital input class-AB amplifier using a digital interface, e.g., to extend application features in system level.

Figure 1:
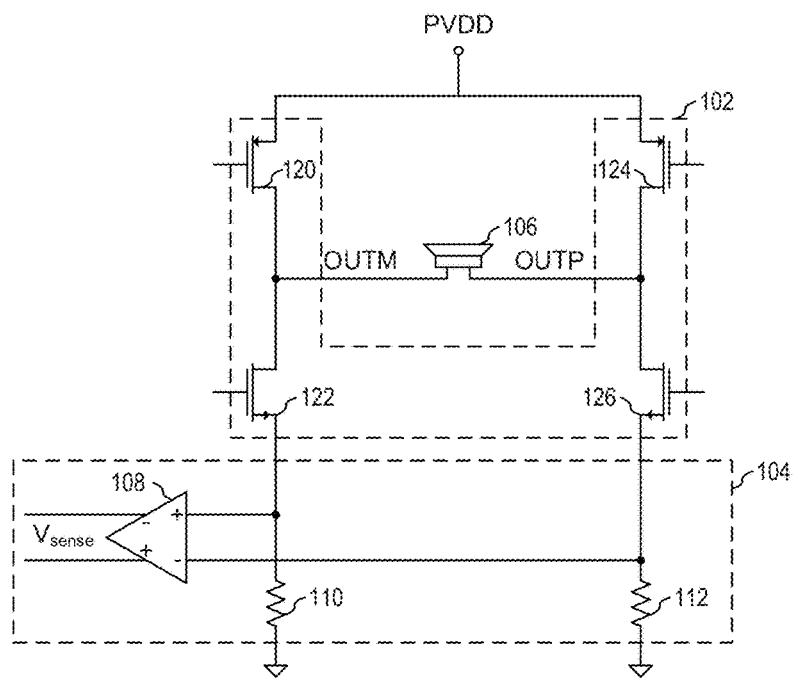
FIG. 1 shows an output stage of a conventional class-AB audio power amplifier for driving an audio speaker, and a load current sensor circuit for sensing a load current flowing through the audio speaker.

As shown in FIG. 1, conventional class-AB audio power amplifier 100 performs load current sensing by monitoring the current flowing on each half-bridge of output stage 102 with respective current sensing resistors 110 and 112 and using current sense buffer 108 to generate voltage $V_{sense}$. Voltage $V_{sense}$ is a voltage proportional to the current flowing through speaker 106. Due to low power dissipation considerations, current sensing resistors 110 and 112 are typically very small (e.g., in the order of several mΩ). The voltage generated across current sensing resistors 110 and 112, is, therefore, also very small, making it hard to accurately measure small load currents.

Figure 2:
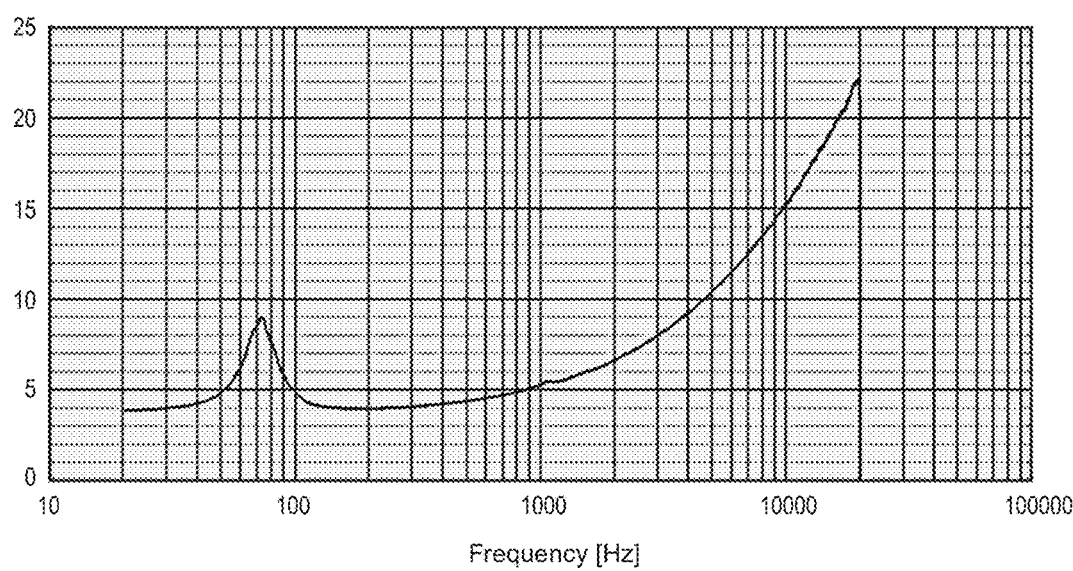
FIG. 2 shows a graph of impedance versus frequency of a typical 4Ω audio speaker.

As shown in FIG. 2, the impedance of an audio speaker may be different for each frequency. For example, the impedance of an audio speaker may be modeled as a resistor in parallel with a capacitor, and then in series with an inductor. Therefore, the impedance of an audio speaker varies based on the frequency content of the audio signal being reproduced by the speaker.

The impedance of an audio speaker may also be affected by process variations. Additionally, the impedance of an audio speaker may change over time (e.g., due to aging), and in real time (e.g., due to changes in temperature of the speaker). Conventional audio systems, therefore, tend to underutilize the audio speaker (e.g., deliver less power to the audio speaker) as a way to ensure the audio speaker is not damaged during operation, e.g., caused by over-displacement and/or overheating of the audio speaker.

In an embodiment of the present invention, a current sensing circuit senses the load current without using a sense resistor in series with the half-bridges of the output stage. Avoiding the use of sense resistors in series with the half-bridges of the output stage advantageously allows for accurately sensing small current without sensing very small voltages (e.g., μV voltages to several mV voltages) across very small sense resistors (e.g., resistors with resistances lower than 1 mΩ to, e.g., 10 mΩ). The sensed load current may be used to estimate the impedance of the audio speaker in real-time, thereby allowing for optimized audio power delivery and audio quality while still protecting the audio speaker.

Figure 3:
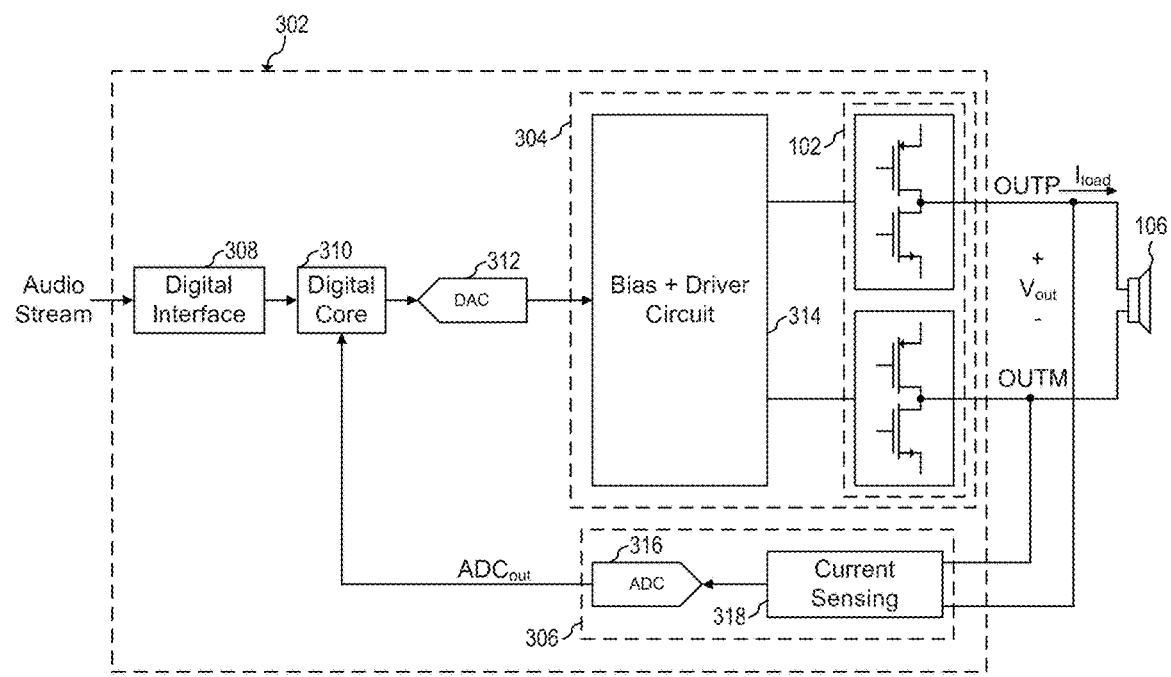
FIG. 3 shows a schematic diagram of a digital input class-AB audio power amplifier, according to an embodiment of the present invention.

FIG. 3 shows a schematic diagram of digital input class-AB audio power amplifier 302, according to an embodiment of the present invention. Digital input class-AB audio power amplifier 302 includes digital interface 308, digital core 310, digital-to-analog converter (DAC) 312, analog class-AB audio power amplifier 304, and load current monitoring circuit 306. Analog class-AB audio power amplifier 304 includes bias and driver circuit 314, and output stage 102. Load current monitoring circuit 306 includes current sensing circuit 318, and analog-to-digital converter (ADC) 316.

During normal operation, digital interface 308 receives a digital audio stream and transmits the audio data to digital core 310. Digital core 310 receives the audio data from digital interface 308, processes the audio data, and transmits the processed audio data to DAC 312. DAC 312 receives the audio data from digital core 310 and coverts it into analog signals that drive the bias and driver circuit 314. Bias and driver circuit 314 drives the output stage 102. Load current monitoring circuit 306 senses the output current by using current sensing circuit 318. Load current monitoring circuit 306 converts the sensed current into digital form using ADC 316 and transmits it to digital core 310.

As shown in FIG. 3, current sensing circuit 318 senses the load current without using a resistor in series with the half-bridges of output stage 102.

Current monitoring circuit 306 is capable of monitoring the load current continuously and in real-time.

Digital core 310 may use the sensed load current for various purposes. For example, in some embodiments, digital core 310 may estimate and monitor the load impedance in real-time based on the sensed current. For example, in some embodiments, digital core 310 determines the impedance $R_{load}$ of audio speaker 106 by $$R_{load} = \frac{V_{out}}{I_{load}} \quad (1)$$

where $I_{load}$ is the current sensed by current sensing circuit 318, and $V_{out}$ is the voltage across audio speaker 106. In some embodiments, voltage $V_{out}$ is measured directly. In other embodiments, voltage $V_{out}$ is estimated, e.g., by $$V_{out} = V_{in} \cdot G \quad (1)$$

where $V_{in}$ is the input voltage, which may be determined from the digital input audio stream, and G is the gain is the digital or analog gain applied to the input voltage $V_{in}$ and is also known.

The real-time load impedance information may be used, e.g., as input for an automatic gain control (AGC), also called automatic volume control (AVC) to adjust output power for different frequency input signals, and optimize sound quality.

Digital core 310 may also use the sensed load current to limit the maximum current flowing through audio speaker 106 to protect audio speaker 106. For example, in some embodiments, upon detection of high load current (e.g., by comparing the sensed current with a threshold), digital core 310 may reduce the amplitude of the signal fed to DAC 312, e.g., by digitally adjusting the gain, to reduce the load current. In some embodiments, digital core 310 may reduce the amplitude of the analog signal that is feeding bias and driver circuit 314 using an analog circuit, inside bias and driver circuit 314 or outside of bias and driver circuit 314.

In some embodiments, digital core 310 does not process the audio data, and, instead, the same audio stream received from digital interface 308 is sent to DAC 312. In some embodiments, digital core 310 processes the audio data by filtering, adding delays, performing data integrity operations and other known audio/data processing techniques.

Digital interface 308 may be implemented in any way known in the art. For example, in some embodiments, digital interface 308 includes an Inter-IC Sound (I²S) interface, an Inter-Integrated Circuit (I²C) interface, a Serial Peripheral Interface (SPI) and/or any other digital interface.

As shown in FIG. 3, the audio stream is received by digital interface 308, e.g., from an external source, such as an external controller, processor or communication circuit. In some embodiments, the audio stream may be generated internally, e.g., from a corresponding non-volatile memory. Other implementations are also possible.

In some embodiments, digital core 310 sends real-time data of the sensed load current and/or real-time data of the impedance of audio speaker 106 to an external user, such as an external controller, via digital interface 308. For example, in some embodiments, an external controller may read real-time load current data using I²S communication and may read real-time load impedance data using I²C. Other implementations are also possible.

Bias and driver circuit 314 is used to drive output stage 102. For example, gate drivers may be used to drive the control terminals of corresponding high-side and low-side transistors of each half-bridge of output stage 102. Bias and driver circuit 314 may be implemented in any way known in the art.

Digital core 310 may be implemented, for example, as custom logic and may include a state machine. In some embodiments, a generic controller or processor may be used to perform some or all of digital core 310 functions.

DAC 312, and ADC 316 may be implemented in any way known in the art. For example, ADC 316 may be implemented as a SAR ADC or as a sigma-delta ADC. DAC 312 may be implemented as a delta-sigma DAC, or as successive approximation DAC, for example. Other implementations are also possible.

In some embodiments, a single integrated circuit (IC) with a monolithic semiconductor substrate includes digital interface 308, digital core 310, DAC 312, bias and driver circuit 314, output stage 102, current sensing circuit 318, and ADC 316. In some embodiments, some of the circuits may be implemented discreetly. For example, in some embodiments, DAC 312, digital interface 310 and digital core 310 may be implemented outside the IC that includes current sensing circuit 318. Other implementations are also possible.

Output stage 102 may be implemented in any way known in the art. For example, in some embodiments, transistors 120 and 124 are power metal-oxide-semiconductor field-effect transistors (MOSFETs) of the p-type, and transistors 122 and 126 are power MOSFETs of the n-type arranged in a bridge tied load (BTL) structure.

Figure 4:
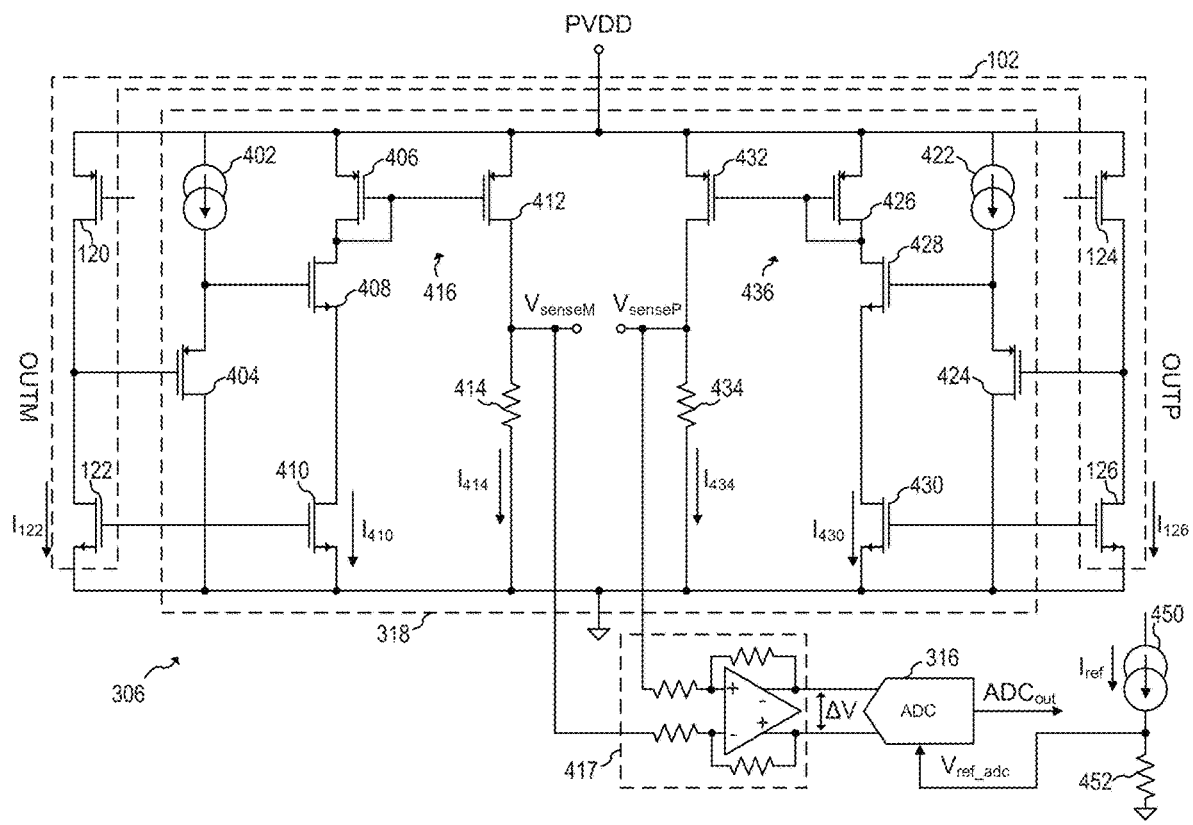
FIG. 4 shows a schematic diagram of the load current monitoring circuit of FIG. 3, according to an embodiment of the present invention.

FIG. 4 shows a schematic diagram of load current monitoring circuit 306, according to an embodiment of the present invention. As shown in FIG. 4, load current monitoring includes current sensing circuit 318, fully-differential buffer 417, and ADC 316.

During normal operation, output stage 102 drives audio speaker 106, e.g., as described with respect to FIG. 3. Sense transistors 410 is used to mirror current $I_{122}$ flowing through power transistor 122 by using transistors 404 and 408 to bias the drain of transistor 410 with a voltage equal to the voltage of output terminal OUTM. Since the gate voltages of transistors 410 and 122 are equal and the drain voltages of transistors 410 and 122 are equal, sense current $I_{410}$ is a scaled copy of current $I_{122}$, where the scaling factor is based on the relative sizes between transistors 410 and 122. Similarly, sense transistors 430 is used to mirror current $I_{26}$ flowing through power transistor 126 by using transistors 424 and 428 to bias the drain of transistor 430 with a voltage equal to the voltage of output terminal OUTP, thus producing sense current $I_{430}$, which is a scaled copy of current $I_{126}$.

Sense current $I_{410}$ is mirrored into sense current $I_{414}$ using current mirror 416, which includes transistors 406 and 412. Sense current $I_{414}$ flows through sense resistors 414 to generate voltage $V_{senseM}$. Similarly, sense current $I_{430}$ is mirrored into sense current $I_{434}$ using current mirror 436, which includes transistors 426 and 432. Sense current $I_{434}$ flows through sense resistors 434 to generate voltage $V_{senseP}$.

Fully-differential buffer 417 receives voltages $V_{senseP}$ and $V_{senseM}$ and level-shifts their DC bias to be the same as the DC bias of comparators of ADC 316, where the DC bias of the comparators of ADC 316 is based on reference voltage $V_{ref\_ade}$. In some embodiments, fully-differential buffer 417 produces differential voltage $\Delta V$ produced with a gain different than 1 (e.g., 2, 2.5, 5, 10, or more, or 0.9, 0.75, 0.5, or less). In other embodiments, fully-differential buffer 417 produces differential voltage $\Delta V$ produced with a gain equal to 1.

ADC 316 samples differential voltage $\Delta V$ and generates digital output $ADC_{out}$, which is sent to digital core 310. As shown in FIG. 4, ADC 316 receives references voltage $V_{ref\_ade}$. Output $ADC_{out}$ of ADC 316 is then the result of the comparison of differential voltage $\Delta V$ with reference voltage $V_{ref\_ade}$. In some embodiments, reference voltage $V_{ref\_ade}$ is generated by flowing reference current $I_{ref}$ through a resistor 452. In some embodiments, resistor 452 is matched with resistors 414 and 434. By matching resistors 414, 434 and 452, process variations affecting the resistances of resistors 414 and 434 are compensated, thus, advantageously allowing for accurate load current sensing across process variations.

Matching between resistors 414, 434 and 452 may be achieved in any way known in the art. For example, in some embodiments, resistors 414, 434, and 452 are disposed next to each other in the layout of the IC with an interdigital structure. For examples, resistors 414, 434 and 452 may be divided into several fingers that are inserted with either other in a symmetrical manner.

In some embodiments, reference current $I_{ref}$ may be trimmed to further improve the accuracy of the current sensing. Trimming may be performed during manufacturing and may be performed in ways known in the art.

Current sources 402 and 422 are used to bias transistors 404 and 424, respectively. In some embodiments, current sources 402 and 422 each produces a current of about 100 μA. Other current amplitudes may be used.

As shown in FIG. 4, sense resistors 414 and 434 are not in series with power transistors 120, 122, 124 or 126. It is possible, therefore, for sense resistors to have a resistance higher than a few mΩ without impacting power consumption or output voltages of output stage 102. For example, in some embodiments, sense resistors 414 and 434 have a resistance between 50 Ω and 150 Ω or about 100Ω. Other resistance values, e.g., higher than 150 Ω or lower than 50 Ω may also be used, such as, e.g., 10 Ω or lower.

Figure 5:
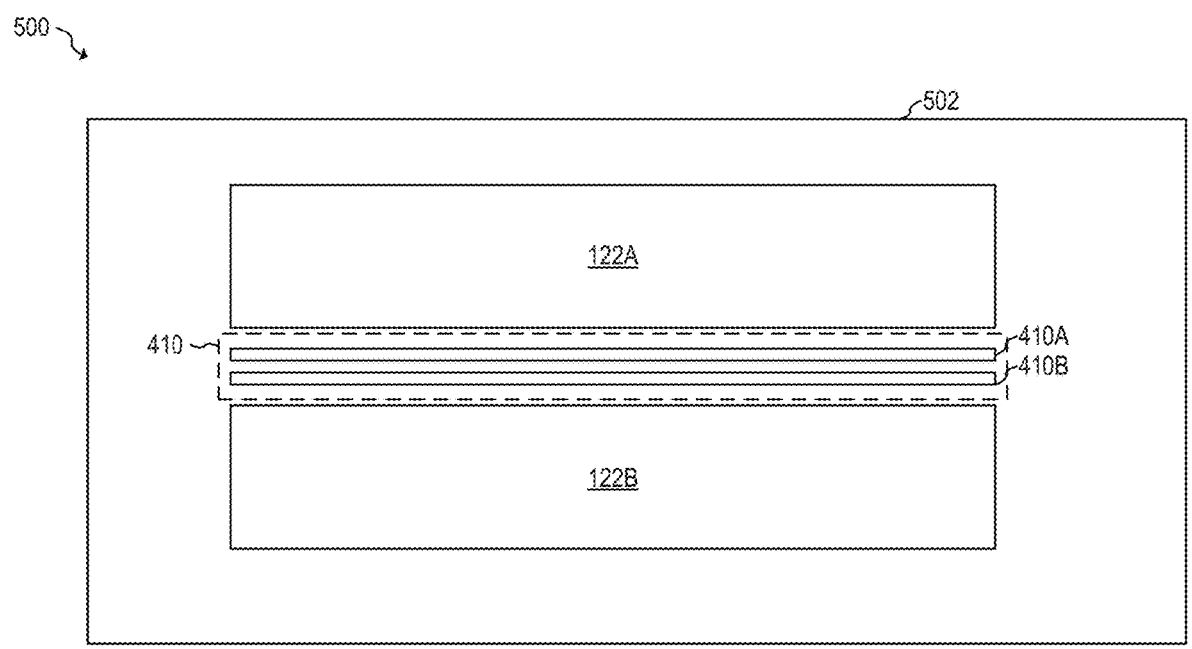
FIG. 5 shows a layout diagram of one of the power transistors and one of the sense transistors of the load current monitoring circuit of FIG. 4, according to an embodiment of the present invention.

In some embodiments, transistors 122 and 410, and transistors 126 and 430 are matched such that current $I_{410}$ tracks current $I_{122}$ and current $I_{126}$ tracks current $I_{430}$. FIG. 5 shows layout diagram 500 of transistors 122 and 410, according to an embodiment of the present invention. Transistors 126 and 430 may be implemented in a similar manner.

As shown in FIG. 5, transistor 122 is disposed in semiconductor substrate 502 and is split in two parts 122A and 122B (e.g., of equal size). Sense transistor 410 is also split in two parts 410A and 410B (e.g., of equal size). The two parts of transistor 410 are disposed between the two parts of transistor 122. By disposing transistor 410 between the two parts of transistor 122, good matching between transistors 122 and 410 is advantageously achieve, as, for example, transistors 122 and 410 would be exposed to substantially the same temperature. Disposing transistors 122 and 410 in very close proximity, such as shown in FIG. 5, also advantageously allows for minimum impact of process variations (i.e., any process variation will impact both transistors in a similar manner).

Achieving good matching between transistors 122 and 410, and between transistors 126 and 430, advantageously allows for currents $I_{410}$ and $I_{430}$ to accurately track currents $I_{122}$ and $I_{126}$.

Advantages of some embodiments include improved accuracy for real-time current sensing of small and large load currents. The sensed current may be used for speaker protection and improved sound quality, characteristics that are desirable in applications such as automotive sound systems.

Figure 6:
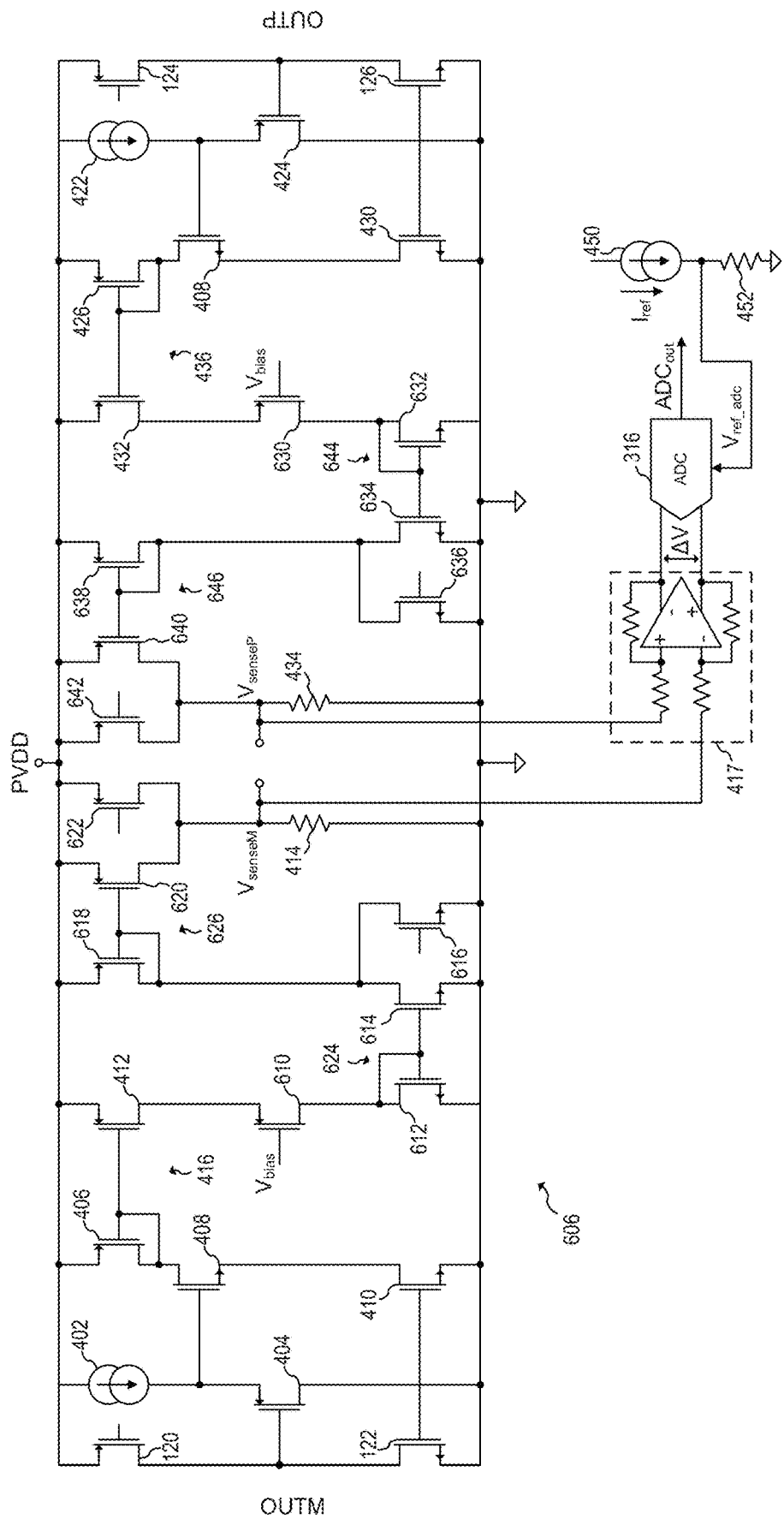
FIG. 6 shows a schematic diagram of a load current monitoring circuit, according to an embodiment of the present invention.

In some embodiments, the load current monitoring circuit is configurable to perform current measurements for more than one current range. For example, FIG. 6 shows a schematic diagram of load current monitoring circuit 606, according to an embodiment of the present invention. Load current monitoring circuit 606 operates in a similar manner as load current monitoring circuit 306. However, load current monitoring circuit 606 includes current mirrors 624, 626, 644 and 646, which may be configured to modify the current mirroring ratio. For example, transistors 616, 622, 636, and 642 may be disabled or activated to modify the current mirroring ratio. For example, in some embodiments, transistors 616, 622, 636 and 642 are enabled by connecting the gates of transistors 616, 622, 636 and 642 with the gates of transistors 614, 620, 634, and 640, respectively. In such embodiments, transistors 616 and 636 may be disabled by connecting the gates of transistors 616 and 636 to GND and transistors 622 and 642 may be disabled by connecting the gates of transistors 616 and 636 to PVDD. It is understood that transistors 616, 622, 636, and 642 may be enabled or disabled independently from each other.

The modification of the range of current measurement, e.g., by enabling or disabling of transistors 616, 622, 636, and 642, may be controlled by one or more control signals. Such one or more control signals may be, e.g., received from digital interface 308. In some embodiments, such control signals may be generated by digital core 310. For example, in some embodiments, a first range (e.g., 2 A) may be initially selected. Upon detection that the current sensed exceeds or is close to exceed 2 A, the control signals enable/disable one or more of transistors 616, 622, 636 and 642 to change the measurement range to a second range (e.g., 4 A).

Modifying the current mirroring ratio advantageously allows for optimizing the accuracy of the current sensing for a particular range. For example, in some embodiments, the current mirroring ratio may be selected such that load current monitoring circuit 606 operates in either 1 A, 2 A, 4 A, and 8 A ranges. By selecting an optimized range (e.g., selecting 2 A when the maximum expected load current is 2 A), dynamic range is optimized as well as overall signal-to-noise ratio (SNR).

Example embodiments of the present invention are summarized here. Other embodiments can also be understood from the entirety of the specification and the claims filed herein.

Example 1. A class-AB amplifier including: an output stage that includes a pair of half-bridges configured to be coupled to a load; and a current sensing circuit coupled to a first half-bridge of the pair of half-bridges, the current sensing circuit including a resistive element and configured to sense a load current flowing through the load by: mirroring a current flowing through a first transistor of the first half-bridge to generate a mirrored current, flowing the mirrored current through the resistive element, and sensing the load current based on a voltage of the resistive element.

Example 2. The class-AB amplifier of example 1, where the current sensing circuit further includes: a second transistor having a control terminal coupled to an output of the first half-bridge; a third transistor having a control terminal coupled to a current path of the second transistor; a sense transistor having a control terminal coupled to a control terminal of the first transistor and having a current path coupled to a current path of the third transistor; and a current mirror coupled between the sense transistor and the resistive element, the current mirror configured to generate the mirrored current.

Example 3. The class-AB amplifier of one of examples 1 or 2, where the first transistor and the sense transistor are matching transistors.

Example 4. The class-AB amplifier of one of examples 1 to 3, where the first transistor has a first portion and a second portion disposed in a semiconductor substrate, and where the sense transistor is disposed between the first portion and the second portion.

Example 5. The class-AB amplifier of one of examples 1 to 4, where the first portion corresponds to a first half of the first transistor, and the second portion corresponds to a second half of the first transistor.

Example 6. The class-AB amplifier of one of examples 1 to 5, where the current mirror includes a current mirror transistor configured to adjust a mirroring ratio of the current mirror based on a control signal.

Example 7. The class-AB amplifier of one of examples 1 to 6, where the current sensing circuit further includes: a second current mirror coupled between the sense transistor and the current mirror, the second current mirror including a second current mirror transistor configured to adjust a mirroring ratio of the second current mirror based on a second control signal.

Example 8. The class-AB amplifier of one of examples 1 to 7, further including an analog-to-digital converter (ADC) configured to generate a digital signal based on the voltage of the resistive element.

Example 9. The class-AB amplifier of one of examples 1 to 8, further including: a reference resistor; and a reference current source configured to inject a reference current into the reference resistor to generate a reference voltage, where the ADC is configured to receive the reference voltage, where the resistive element includes a first resistor, and where the first resistor and the reference resistor are matching resistors.

Example 10. The class-AB amplifier of one of examples 1 to 9, further including a fully-differential buffer coupled between the resistive element and the ADC, where the ADC is configured to receive a reference voltage, and where the fully-differential buffer is configured to level-shift the voltage of the resistive element to have a DC bias substantially equal to a DC bias of comparators in the ADC, and where the DC bias of comparators in the ADC is based on the reference voltage.

Example 11. The class-AB amplifier of one of examples 1 to 10, further including a digital core circuit configured to receive the digital signal from the ADC and configured to calculate a load impedance based on the digital signal.

Example 12. The class-AB amplifier of one of examples 1 to 11, further including a digital core circuit configured to receive the digital signal from the ADC and configured to limit the load current based on the digital signal.

Example 13. The class-AB amplifier of one of examples 1 to 12, further including the load, where the load is an audio speaker coupled the pair of half-bridges.

Example 14. The class-AB amplifier of one of examples 1 to 13, where the first transistor is a low-side transistor of the pair of half-bridges.

Example 15. The class-AB amplifier of one of examples 1 to 14, where the resistive element includes a resistor having a resistance of 10 Ω or higher.

Example 16. A digital input class-AB amplifier including: an output stage that includes a pair of half-bridges configured to be coupled to a load; a digital communication interface configured to receive an data stream; a digital core circuit; a digital-to-analog converter (DAC); a driver circuit configure to receive a signal from the DAC, and configured to control the output stage based on the received signal; a current sensing circuit coupled to a first half-bridge of the pair of half-bridges, the current sensing circuit including a resistive element and configured to sense a load current flowing through the load by: mirroring a current flowing through a first transistor of the first half-bridge to generate a mirrored current, flowing the mirrored current through the resistive element, and sensing the load current based on a voltage of the resistive element; and an analog-to-digital converter (ADC) coupled to the digital core circuit and configured to generate a digital signal based on the sensed load current.

Example 17. The digital input class-AB amplifier of example 16, where the digital core circuit is configured to receive real-time load current data from the ADC.

Example 18. The digital input class-AB amplifier of one of examples 16 or 17, where the digital core circuit is further configured to send the real-time load current data to an external user via the digital communication interface.

Example 19. The digital input class-AB amplifier of one of examples 16 to 18, where the digital core circuit is further configured to calculate a load impedance of the load based on the real-time load current data.

Example 20. The digital input class-AB amplifier of one of examples 16 to 19, where the digital core circuit is further configured to send the load impedance via the digital communication interface.

Example 21. The digital input class-AB amplifier of one of examples 16 to 20, where the digital core circuit is further configured to limit the load current based on the real-time load current data.

Example 22. The digital input class-AB amplifier of one of examples 16 to 21, where the current sensing circuit further includes: a second transistor having a control terminal coupled to an output of the first half-bridge; a third transistor having a control terminal coupled to a current path of the second transistor; a sense transistor having a control terminal coupled to a control terminal of the first transistor and having a current path coupled to a current path of the third transistor; and a current mirror coupled between the sense transistor and the resistive element, the current mirror configured to generate the mirrored current.

Example 23. The digital input class-AB amplifier of one of examples 16 to 22, where the digital communication interface includes an Inter-IC Sound (I2S) interface, where the data stream includes an audio stream and where the I2S interface is configured to receive the data stream.

Example 24. A method including: driving a load with a class-AB amplifier; mirroring a current flowing through a first transistor of an output stage of the class-AB amplifier to generate a mirrored current; flowing the mirrored current through a resistive element; and sensing a load current flowing through the load based on a voltage of the resistive element.

Example 25. The method of example 24, where the load is an audio speaker.

Example 26. The method of one of examples 24 or 25, where the first transistor is a low-side transistor of the output stage.

Example 27. The method of one of examples 24 to 26, where the resistive element includes a resistor having a resistance of at least 10Ω.

Example 28. The method of one of examples 24 to 27, where the first transistor is a power metal-oxide-semiconductor field-effect transistor (MOSFET).

Example 29. A digital input class-AB amplifier including: an output stage that includes a pair of half-bridges configured to be coupled to an audio speaker; a digital communication interface configured to receive an audio stream; a digital core circuit; a digital-to-analog converter (DAC); a driver circuit configure to receive a signal from the DAC, and configured to control the output stage based on the received signal; a current sensing circuit including: a second transistor having a control terminal coupled to an output of a first half-bridge of the pair of half-bridges; a third transistor having a control terminal coupled to a current path of the second transistor; a first sense transistor having a control terminal coupled to a control terminal of a first transistor of the first half-bridge and having a current path coupled to a current path of the third transistor; a first resistor; a first current mirror coupled between the first sense transistor and the first resistor, the first current mirror configured to generate a first mirrored current that flows through the first resistor; a fourth transistor having a control terminal coupled to an output of a second half-bridge of the pair of half-bridges; a fifth transistor having a control terminal coupled to a current path of the fourth transistor; a second sense transistor having a control terminal coupled to a control terminal of a sixth transistor of the second half-bridge and having a current path coupled to a current path of the fifth transistor; a second resistor; a second current mirror coupled between the second sense transistor and the second resistor, the second current mirror configured to generate a second mirrored current that flows through the second resistor; and an analog-to-digital converter (ADC) coupled to the first and second resistors, the ADC configured to generate a digital signal based on voltage difference between a first node of the first resistor and a second node of the second resistor, where the digital core circuit is configured to estimate an impedance of the audio speaker based on the digital signal.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A class-AB amplifier comprising:
   an output stage that comprises a pair of half-bridges configured to be coupled to a load; and
   a current sensing circuit having a high impedance input coupled to a first half-bridge of the pair of half-bridges, the current sensing circuit comprising a resistive element and configured to sense a load current flowing through the load by:
      mirroring a current flowing through a first transistor of the first half-bridge to generate a mirrored current based on the high impedance input of the current sensing circuit,
      flowing the mirrored current through the resistive element, and
      sensing the load current based on a voltage of the resistive element, wherein the mirrored current is configured to flow through a path different from the load.

2. A class-AB amplifier comprising:
   an output stage that comprises a pair of half-bridges configured to be coupled to a load; and
   a current sensing circuit coupled to a first half-bridge of the pair of half-bridges, the current sensing circuit comprising a resistive element and configured to sense a load current flowing through the load by:
      mirroring a current flowing through a first transistor of the first half-bridge to generate a mirrored current,
      flowing the mirrored current through the resistive element, and
      sensing the load current based on a voltage of the resistive element, wherein the current sensing circuit further comprises:
   a second transistor having a control terminal coupled to an output of the first half-bridge;
   a third transistor having a control terminal coupled to a current path of the second transistor;
   a sense transistor having a control terminal coupled to a control terminal of the first transistor and having a current path coupled to a current path of the third transistor; and
   a current mirror coupled between the sense transistor and the resistive element, the current mirror configured to generate the mirrored current.

3. The class-AB amplifier of claim 2, wherein the first transistor and the sense transistor are matching transistors.

4. The class-AB amplifier of claim 3, wherein the first transistor has a first portion and a second portion disposed in a semiconductor substrate, and wherein the sense transistor is disposed between the first portion and the second portion.

5. The class-AB amplifier of claim 4, wherein the first portion corresponds to a first half of the first transistor, and the second portion corresponds to a second half of the first transistor.

6. The class-AB amplifier of claim 2, wherein the current mirror comprises a current mirror transistor configured to adjust a mirroring ratio of the current mirror based on a control signal.

7. The class-AB amplifier of claim 6, wherein the current sensing circuit further comprises:
   a second current mirror coupled between the sense transistor and the current mirror, the second current mirror comprising a second current mirror transistor configured to adjust a mirroring ratio of the second current mirror based on a second control signal.

8. The class-AB amplifier of claim 1, further comprising an analog-to-digital converter (ADC) configured to generate a digital signal based on the voltage of the resistive element.

9. A class-AB amplifier comprising:
   an output stage that comprises a pair of half-bridges configured to be coupled to a load;
   a current sensing circuit coupled to a first half-bridge of the pair of half-bridges, the current sensing circuit comprising a resistive element and configured to sense a load current flowing through the load by:
      mirroring a current flowing through a first transistor of the first half-bridge to generate a mirrored current,
      flowing the mirrored current through the resistive element, and
      sensing the load current based on a voltage of the resistive element;
   an analog-to-digital converter (ADC) configured to generate a digital signal based on the voltage of the resistive element;
   a reference resistor; and
   a reference current source configured to inject a reference current into the reference resistor to generate a reference voltage, wherein the ADC is configured to receive the reference voltage, wherein the resistive element comprises a first resistor, and wherein the first resistor and the reference resistor are matching resistors.

10. The class-AB amplifier of claim 8, further comprising a fully-differential buffer coupled between the resistive element and the ADC, wherein the ADC is configured to receive a reference voltage, and wherein the fully-differential buffer is configured to level-shift the voltage of the resistive element to have a DC bias substantially equal to a DC bias of comparators in the ADC, and wherein the DC bias of comparators in the ADC is based on the reference voltage.

11. The class-AB amplifier of claim 8, further comprising a digital core circuit configured to receive the digital signal from the ADC and configured to calculate a load impedance based on the digital signal.

12. The class-AB amplifier of claim 8, further comprising a digital core circuit configured to receive the digital signal from the ADC and configured to limit the load current based on the digital signal.

13. The class-AB amplifier of claim 1, further comprising the load, wherein the load is an audio speaker coupled the pair of half-bridges.

14. The class-AB amplifier of claim 1, wherein the first transistor is a low-side transistor of the pair of half-bridges.

15. The class-AB amplifier of claim 1, wherein the resistive element comprises a resistor having a resistance of 10Ω or higher.

16. A digital input class-AB amplifier comprising:
an output stage that comprises a pair of half-bridges configured to be coupled to a load;
a digital communication interface configured to receive an data stream;
a digital core circuit;
a digital-to-analog converter (DAC);
a driver circuit configure to receive a signal from the DAC, and configured to control the output stage based on the received signal;
a current sensing circuit coupled to a first half-bridge of the pair of half-bridges, the current sensing circuit comprising a resistive element and configured to sense a load current flowing through the load by:
mirroring a current flowing through a first transistor of the first half-bridge to generate a mirrored current,
flowing the mirrored current through the resistive element, and
sensing the load current based on a voltage of the resistive element; and
an analog-to-digital converter (ADC) coupled to the digital core circuit and configured to generate a digital signal based on the sensed load current.

17. The digital input class-AB amplifier of claim 16, wherein the digital core circuit is configured to receive real-time load current data from the ADC.

18. The digital input class-AB amplifier of claim 17, wherein the digital core circuit is further configured to send the real-time load current data to an external user via the digital communication interface.

19. The digital input class-AB amplifier of claim 17, wherein the digital core circuit is further configured to calculate a load impedance of the load based on the real-time load current data.

20. The digital input class-AB amplifier of claim 19, wherein the digital core circuit is further configured to send the load impedance via the digital communication interface.

21. The digital input class-AB amplifier of claim 17, wherein the digital core circuit is further configured to limit the load current based on the real-time load current data.

22. The digital input class-AB amplifier of claim 16, wherein the current sensing circuit further comprises:
a second transistor having a control terminal coupled to an output of the first half-bridge;
a third transistor having a control terminal coupled to a current path of the second transistor;
a sense transistor having a control terminal coupled to a control terminal of the first transistor and having a current path coupled to a current path of the third transistor; and
a current mirror coupled between the sense transistor and the resistive element, the current mirror configured to generate the mirrored current.

23. The digital input class-AB amplifier of claim 16, wherein the digital communication interface comprises an Inter-IC Sound ($I^2S$) interface, wherein the data stream comprises an audio stream and wherein the $I^2S$ interface is configured to receive the data stream.

24. A method comprising:
driving a load with a class-AB amplifier;
mirroring a current flowing through a first transistor of an output stage of the class-AB amplifier to generate a mirrored current based on a high impedance input of a current sensing circuit coupled to the first transistor;
flowing the mirrored current through a resistive element of the current sensing circuit; and
sensing a load current flowing through the load based on a voltage of the resistive element, wherein the current sensing circuit further comprises:
a second transistor having a control terminal coupled to the high impedance input of the current sensing circuit, and
a third transistor having a control terminal coupled to a current path of the second transistor, wherein the mirrored current is based on a current flowing through a current path of the third transistor.

25. The method of claim 24, wherein the load is an audio speaker.

26. The method of claim 24, wherein the first transistor is a low-side transistor of the output stage.

27. The method of claim 24, wherein the resistive element comprises a resistor having a resistance of at least 10 Ω.

28. The method of claim 24, wherein the first transistor is a power metal-oxide-semiconductor field-effect transistor (MOSFET).

29. A digital input class-AB amplifier comprising:
an output stage that comprises a pair of half-bridges configured to be coupled to an audio speaker;
a digital communication interface configured to receive an audio stream;
a digital core circuit;
a digital-to-analog converter (DAC);
a driver circuit configure to receive a signal from the DAC, and configured to control the output stage based on the received signal;
a current sensing circuit comprising:
a second transistor having a control terminal coupled to an output of a first half-bridge of the pair of half-bridges;
a third transistor having a control terminal coupled to a current path of the second transistor;
a first sense transistor having a control terminal coupled to a control terminal of a first transistor of the first half-bridge and having a current path coupled to a current path of the third transistor;
a first resistor;
a first current mirror coupled between the first sense transistor and the first resistor, the first current mirror configured to generate a first mirrored current that flows through the first resistor;
a fourth transistor having a control terminal coupled to an output of a second half-bridge of the pair of half-bridges;

a fifth transistor having a control terminal coupled to a current path of the fourth transistor;
a second sense transistor having a control terminal coupled to a control terminal of a sixth transistor of the second half-bridge and having a current path coupled to a current path of the fifth transistor;
a second resistor;
a second current mirror coupled between the second sense transistor and the second resistor, the second current mirror configured to generate a second mirrored current that flows through the second resistor; and
an analog-to-digital converter (ADC) coupled to the first and second resistors, the ADC configured to generate a digital signal based on voltage difference between a first node of the first resistor and a second node of the second resistor, wherein the digital core circuit is configured to estimate an impedance of the audio speaker based on the digital signal.

\* \* \* \* \*